(12) United States Patent
Choi et al.

(10) Patent No.: US 12,334,905 B2
(45) Date of Patent: Jun. 17, 2025

(54) ACOUSTIC RESONATOR

(71) Applicant: WISOL CO., LTD., Gyeonggi-do (KR)

(72) Inventors: Hoan Jun Choi, Gyeonggi-do (KR);
Tah Joon Park, Gyeonggi-do (KR);
Byung Hun Kim, Gyeonggi-do (KR);
Jong Hyeon Park, Gyeonggi-do (KR)

(73) Assignee: WISOL CO., LTD., Gyeonggi-do (KR)

( * ) Notice: Subject to any disclaimer, the term of this patent is extended or adjusted under 35 U.S.C. 154(b) by 296 days.

(21) Appl. No.: 17/854,116

(22) Filed: Jun. 30, 2022

(65) Prior Publication Data

US 2023/0006643 A1 Jan. 5, 2023

(30) Foreign Application Priority Data

Jul. 1, 2021 (KR) .......................... 10-2021-0086243

(51) Int. Cl.
*H03H 9/17* (2006.01)
*H03H 9/02* (2006.01)
(52) U.S. Cl.
CPC ........ *H03H 9/172* (2013.01); *H03H 9/02015* (2013.01)
(58) Field of Classification Search
CPC .... H03H 9/172; H03H 3/02; H03H 2003/021; H03H 9/02015
USPC ........................................................ 333/187
See application file for complete search history.

(56) References Cited

U.S. PATENT DOCUMENTS

| 2014/0176261 | A1* | 6/2014 | Burak | ...................... | H03H 9/54 |
| | | | | | 333/187 |
| 2015/0318837 | A1* | 11/2015 | Zou | ..................... | H03H 9/02086 |
| | | | | | 333/187 |
| 2019/0356293 | A1* | 11/2019 | Kim | ........................ | H03H 3/04 |

FOREIGN PATENT DOCUMENTS

| KR | 10-2004-0102390 A | 12/2004 |
| KR | 10-2016-0015628 A | 2/2016 |
| KR | 10-2016-0069263 A | 6/2016 |

OTHER PUBLICATIONS

Office Action from corresponding Korean Patent Application No. 10/2021-0086243, dated Oct. 17, 2023.

* cited by examiner

*Primary Examiner* — Andrea Lindgren Baltzell
*Assistant Examiner* — Abigail Amir Yaldo
(74) *Attorney, Agent, or Firm* — Harness, Dickey & Pierce, P.L.C.

(57) ABSTRACT

Disclosed is an acoustic resonator including a substrate including a first cavity, a first electrode formed above the substrate, a piezoelectric layer formed on one surface of the first electrode, and a second electrode formed on one surface of the piezoelectric layer. Here, the piezoelectric layer includes a longitudinal section not to cover a longitudinal section of the first electrode. Also, the second electrode covers the longitudinal section of the piezoelectric layer and extends to a first interpolar cavity which spaces the first electrode at least partially apart from the piezoelectric layer. A quality factor may be increased by fixing an increase in resistance which occurs due to thin film electrodes.

7 Claims, 9 Drawing Sheets

ACOUSTIC RESONATOR

CROSS-REFERENCE TO RELATED APPLICATION

This application claims the benefit of Korean Patent Application No. 10-2021-0086243, filed on 1 Jul. 2021, in the Korean Intellectual Property Office, the disclosure of which is incorporated herein in its entirety by reference.

FIELD

The present invention relates to a resonator used for radio frequency (RF) communication, and more particularly, to a film bulk acoustic resonator (FBAR) with less power loss.

BACKGROUND

Wireless mobile communication technology requires a variety of radio frequency (RF) components capable of efficiently transmitting information within a limited frequency band. Particularly, among RF components, a filter is one of essential components used in mobile communication technology and enables high-quality communication by selecting a signal needed by a user among a plurality of frequency bands or filtering a signal to be transmitted.

Currently, a dielectric filter and a surface acoustic wave (hereinafter, referred to as SAW) filter have been used most as RF filters for wireless communication. The dielectric filter has advantages such as a high dielectric constant, a low insertion loss, stability at a high temperature, high vibration resistance, and high shock resistance. However, the dielectric filter has limitations in miniaturization and monolithic microwave integrated circuit (MMIC) fields which are recent trends of technology development. Also, in comparison to the dielectric filter, the SAW filter has a small size, easily processes a signal, has a simple circuit, and is manufactured using a semiconductor process so as to facilitate mass production. Also, the SAW filter has an advantage of transmitting and receiving high-grade information due to high side rejection within a passband in comparison to the dielectric filter. However, since an SAW filter process includes an exposure process using ultraviolet (UV), there is a disadvantage in which a line width of an interdigital transducer (IDT) is limited to about 0.5 µm. Accordingly, there is a problem in which it is impossible to cover an ultrahigh frequency band of 3 GHz or more using the SAW filter, and thus, there is a basic difficulty in forming an MMIC structure and a single chip on a semiconductor substrate.

In order to overcome such limitations and problems, there has been provided a film bulk acoustic resonator (FBAR) filter capable of completely implementing a frequency control circuit, which is integrated with other active devices on an existing semiconductor (Si or GaAs) substrate, as an MMIC.

The FBAR is a thin film device which is low-cost, small-sized, and features a high quality factor so as to be applicable to a wireless communication device, a military-use radar, and the like in a variety of frequency bands of 900 MHz to 10 GHz. Also, the FBAR is reduced in size as one-several hundredth of the dielectric filter and a lumped constant (LC) filter and has a very smaller insertion loss than the SAW filter. Accordingly, the FBAR is considered as one of most adequate devices for an MMIC which requires high stability and a high quality factor.

An FBAR filter is formed by depositing zinc oxide (ZnO), aluminum nitride (AlN), or the like, which is a piezoelectric-dielectric material, on silicon (Si) or gallium arsenide (GaAs), which is a semiconductor substrate, using an RF sputtering method and thus causes a resonance due to a piezoelectric property. That is, the FBAR may generate a resonance through depositing of a piezoelectric thin film between both electrodes and causing a bulk acoustic wave.

A variety of forms of FBAR structures have been studied until now. In the case of a membrane type FBAR, a silicon oxide ($SiO_2$) film is deposited on a substrate and a membrane layer is formed using a cavity formed in an opposite side of the substrate through isotropic etching. Also, a lower electrode is formed above the SiO2 film, a piezoelectric layer is formed by depositing a piezoelectric material above the lower electrode using an RF magnetron sputtering method, and an upper electrode is formed above the piezoelectric layer.

The above membrane type FBAR has advantages of less power loss and dielectric loss due to the cavity. However, the membrane type FBAR has problems in which a device-occupied area is large due to a directivity of the silicon substrate and a decrease in yield caused by damages due to low structural stability in a follow-up packaging process. Accordingly, recently, in order to reduce a loss caused by the membrane and to simplify a device manufacturing process, an air gap type FBAR and a Bragg reflector type FBAR have appeared.

The Bragg reflector type FBAR has a structure in which a reflector layer is formed by alternately depositing materials having a high acoustic impedance difference therebetween on a substrate and a lower electrode, a piezoelectric layer, and an upper electrode are sequentially stacked. Here, acoustic wave energy which has passed through the piezoelectric layer may not be transferred toward the substrate and all reflected by the reflector layer so as to efficiently generate a resonance. Although the Bragg reflector type FBAR is structurally sound and has no stress caused by flexure, there are disadvantages in which it is difficult to precisely form the reflector layer which has a reflective layer with thickness of 4 or more layers for total reflection and much time and great expense for manufacturing are required.

Meanwhile, in the case of conventional FBARs having a structure in which a substrate is isolated from a resonance portion using an air gap instead of a reflector layer, a sacrificial layer is implemented through anisotropic etching on the surface of a silicon substrate and surface-treated through chemical-mechanical polishing, an insulation layer, a lower electrode, a piezoelectric layer, and an upper electrode are sequentially deposited, and the sacrificial layer is removed and the air gap is formed through a via hole so as to implement an FBAR.

In the conventional FBAR structure, the piezoelectric layer is formed between the upper and lower electrodes and the upper and lower electrodes are installed only in a necessary area of the piezoelectric layer so that the piezoelectric effect is used. Accordingly, the conventional structure has a great mechanical anchor loss which causes a decrease in mechanical energy.

In the case of the upper electrode or lower electrode, molybdenum (Mo), ruthenium (Ru), tungsten (W), and the like are used to increase acoustic impedance. Since a skin depth of an electrode material is determined depending on a frequency of the filter and electrodes generally have thicknesses much smaller than the skin depth, charges formed at a resonance point of the piezoelectric layer are not transferred enough through lead and thus a quality factor is decreased.

RELATED ART DOCUMENT

Patent Document

Patent Document 0001: Korean Patent Publication No. 10-2004-0102390 (published on Dec. 8, 2004)

SUMMARY

The present invention is directed to fixing an increase in electrical loss which is caused by induction hardening and indicated as a problem of thin film electrodes.

The present invention is also directed to compensating for an electrical loss of a conventional thin film electrode, which is indicated as a problem, through a change in pad position and structural changes of electrodes and a piezoelectric layer in an acoustic resonator.

The present invention is also directed to providing an electrode structure appropriate for removing parasitic capacitance which occurs due to electrodes arranged in proximity to each other.

The present invention is also directed to fixing problems caused by increased resistance due to thinning of electrodes due to increase in signal frequency that the filter must process.

According to an aspect of the present invention, there is provided an acoustic resonator including a substrate including a first cavity, a first electrode formed above the substrate, a piezoelectric layer formed on one surface of the first electrode, and a second electrode formed on one surface of the piezoelectric layer. Here, the first electrode and the piezoelectric layer include an overlap area corresponding to one edge to the other edge of the first cavity. The first electrode has a longitudinal section outside the overlap area on the basis of the other edge of the first cavity. The piezoelectric layer has a longitudinal section not to cover the longitudinal section of the first electrode. The second electrode is overlapped with the first cavity, covers the longitudinal section of the piezoelectric layer, and extends to one or more interpolar cavities which maintain a gap between the second electrode and the first electrode.

The interpolar cavities may include a first interpolar cavity which covers the longitudinal section of the first electrode and part of the substrate, comes into contact with a bottom surface to which the second electrode extends, and is formed between the first electrode and the piezoelectric layer outside the overlap area on the basis of the other edge of the first cavity.

Also, the interpolar cavity may further include a second interpolar cavity which comes into contact with the second electrode and the longitudinal section of the piezoelectric layer.

The acoustic resonator may further include a second interpolar cavity which comes into contact with the second electrode, the longitudinal section of the piezoelectric layer, and the first interpolar cavity.

The second electrode may include a wing area having a second cavity near the one edge of the overlap area between the second electrode and the piezoelectric layer.

The second electrode may include a wing area having a second cavity on one side and a bridge area having a third cavity on the other side between the second electrode and the piezoelectric layer. Also, the second cavity, the third cavity, and the first interpolar cavity may be filled with air.

The first electrode and the piezoelectric layer comprise an overlap area corresponding to one edge to the other edge of the first cavity, and the second electrode may be thicker in an extending area than in the overlap area.

The second electrode may have a thickness which extends in a V-shape or U-shape according to a shape of the longitudinal section of the piezoelectric layer.

The piezoelectric layer may be longitudinally cut at a position not to cover the longitudinal section of the first electrode.

The acoustic resonator may further include a passivation layer formed on one surface of the second electrode.

The acoustic resonator may further include a conductive pattern layer formed above the first electrode outside the overlap area on the basis of the one edge of the first cavity.

The acoustic resonator may further include a conductive pattern layer formed above the second electrode outside the overlap area on the basis of the other edge of the first cavity.

According to another aspect of the present invention, there is provided an acoustic resonator including a substrate including a first cavity, a first electrode formed above the substrate, a piezoelectric layer formed on one surface of the first electrode, and a second electrode formed on one surface of the piezoelectric layer. Here, the first electrode and the piezoelectric layer include an overlap area corresponding to one edge to the other edge of the first cavity. The first electrode has a longitudinal section outside the overlap area on the basis of the other edge of the first cavity. The piezoelectric layer is separated into a first part to which the overlap area belongs and a second part which does not come into contact with the first electrode and has a longitudinal section formed on each thereof due to a valley-shaped etching area formed thereabove. Also, the second electrode includes the overlap area and is formed above the etching area according to the valley shape.

The second electrode may include a wing area having a second cavity near the one edge of the overlap area between the second electrode and the piezoelectric layer.

The second electrode may include a bridge area having a third cavity near the other edge of the overlap area between the second electrode and the piezoelectric layer.

The third cavity may extend to the first part of the piezoelectric layer, the first electrode, and the longitudinal section of the second part.

The second electrode may be thicker in the etching area than in the overlap area.

The second electrode may have a thickness which extends in a V-shape or U-shape according to the valley shape.

The second electrode may have a lowermost surface within a range of a height of the first electrode or higher so as to include a cavity having a depth of a thickness of the first electrode or greater between the second electrode and the longitudinal section of the first electrode.

The piezoelectric layer may have the first part which is longitudinally cut at a position not to cover the longitudinal section of the first electrode.

The acoustic resonator may further include a passivation layer formed on one surface of the second electrode.

The acoustic resonator may further include a conductive pattern layer formed above the first electrode outside the overlap area on the basis of the one edge of the first cavity.

The acoustic resonator may further include a conductive pattern layer formed above the second electrode outside the overlap area on the basis of the other edge of the first cavity.

According to another embodiment of the present invention, there is provided a method of manufacturing an acoustic resonator. The method includes forming a first cavity in a partial area above a substrate, forming a first electrode to be overlapped with one edge to the other edge of the first cavity and longitudinally cut outside an overlap area on the basis of the other edge of the first cavity, forming a piezoelectric layer to be longitudinally cut without covering a longitudinal section of the first electrode, and forming a second electrode to cover a longitudinal section of the piezoelectric layer and extend to one or more interpolar cavities which maintain a gap between the second electrode and the first electrode.

The method may further include forming a first spacer or a sacrificial layer for forming a first interpolar cavity between the longitudinal section of the first electrode and the second electrode to cover the longitudinal section of the first electrode.

The method may further include forming a second spacer which is disposed between the longitudinal section of the first electrode and the second electrode and covers a longitudinal section of a first part of the piezoelectric layer.

According to another aspect of the present invention, there is provided a method of manufacturing an acoustic resonator. The method includes forming a first cavity in a partial area above a substrate, forming a first electrode to be overlapped with one edge to the other edge of the first cavity and longitudinally cut outside an overlap area on the basis of the other edge of the first cavity, forming a piezoelectric layer to be longitudinally cut without covering a longitudinal section of the first electrode, and forming a piezoelectric layer on one surface of the first electrode and the substrate to have longitudinal sections on a first part to which the overlap area belongs and a second part which does not come into contact with the first electrode due to a valley-shaped etching area formed thereabove, and forming a second electrode overlapped with the first cavity on the etching area according to the valley shape.

The method may further include forming a sacrificial layer for forming a second cavity and a third cavity between the second electrode and the piezoelectric layer near one edge and the other edge of the overlap area.

The method may further include forming a sacrificial layer for forming cavities between the second electrode and longitudinal sections of the first part and the second part of the piezoelectric layer, respectively.

The method may further include further growing a thickness of the second electrode above the etching area than in the overlap area.

The method may further include etching the piezoelectric layer to form a V-shaped or U-shaped valley which separates the piezoelectric layer into the first part and the second part.

The method may further include a sacrificial layer for forming a cavity which comes into contact with the longitudinal section of the first electrode and the second part of the piezoelectric layer.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
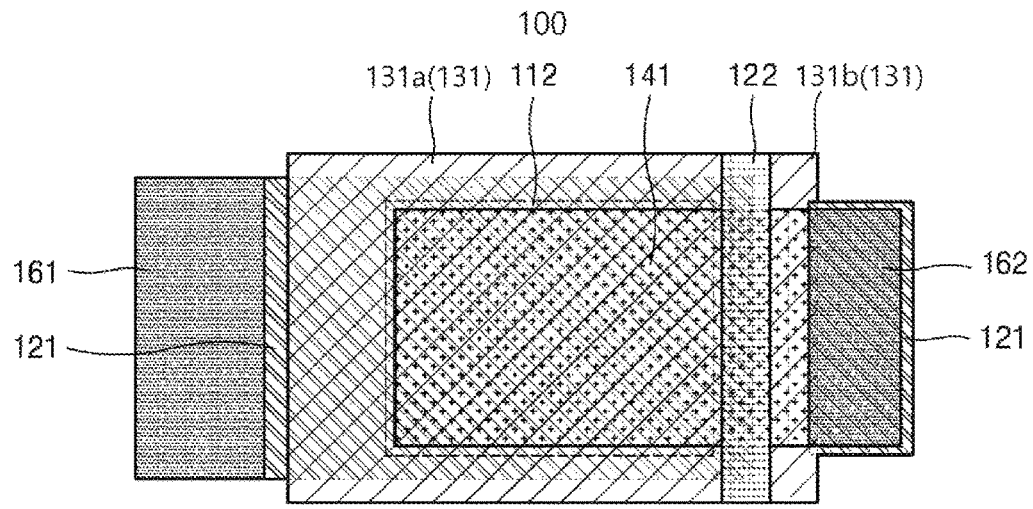
FIG. 1 is a top view of an acoustic resonator according to a first embodiment of the present invention.

Before detailed description of the present invention, the terms or words used in the specification should not be limited to general or lexical meanings unconditionally. Also, the concepts of a variety of terms may be appropriately defined by the inventor to describe the present invention in the best way. In addition, it should be noted that these terms or words will be construed as meanings and concepts according to the technical concept of the present invention.

That is, it should be noted that terms used herein are merely for describing exemplary embodiments of the present invention and not be intended to limit the content of the present invention in detail and these terms are defined in consideration of a variety of possibilities of the present invention.

Also, it should be noted that singular forms may include plural forms unless particularly defined otherwise in context and vice versa.

Throughout the specification, when one element is stated as "including" another element, unless particularly defined otherwise, the element does not exclude other elements and may further include other elements.

Furthermore, when one element is stated as "being present or installed in while being connected to" another element, the element may be installed while being directly connected to or in contact with the other element or while being spaced apart at a certain distance therefrom. When the element is installed while being spaced apart at a certain distance, still other elements or devices for fixing or connecting the corresponding element to the other element may be present. A description on the still other elements may be omitted.

On the other hand, when one element is stated as "directly connected to" or "coming into direct contact with" another element, it should be understood that there is no present still other elements or devices.

Likewise, other terms describing a relationship between components, that is, "between" and "right between," "adjacent to" and "directly adjacent to," and the like should be construed equally.

Also, in the specification, the terms such as "one surface," "the other surface," "one side," "the other side," "first," "second," and the like are used to distinguish one element from others clearly and it should be noted that the meaning of the corresponding element is not limited by the above terms.

Also, in the specification, it should be understood that terms in relation to position such as "above," "below," "left," "right," and the like are used to indicate relative positions of elements in the drawing and the position-related terms are not intended to state absolute positions of the elements unless the absolute positions are defined.

Also, in the specifications, when each element in each drawing is specified as a reference numeral, the element is referred to as the same reference numeral even in different drawings, that is, like elements will be referred to as like reference numerals throughout the specification.

In the drawings attached to the specification, in order to transfer the concept of the present invention with satisfactory accuracy or for convenience of description, a size, position, a combination relation, and the like of elements included in the present invention may be partially exaggerated, reduced, or omitted, and thus proportions or scales thereof may not be precise.

Hereinafter, in description of the present invention, detailed description of components in well-known arts related to the present invention will be omitted when it is deemed to unnecessarily obscure the essentials of the present invention.

Hereinafter, embodiments of the present invention will be described in detail with reference to related drawings.

An acoustic resonator 100, 200, 300, or 400 according to one embodiment of the present invention may be formed by stacking a plurality of layers having different materials and the plurality of stacked layers may have polygonal shapes. However, for convenience of description, tops views of quadrangular structures shown in FIGS. 1, 4, and 6 partially illustrate the entire shapes.

Figure 2:
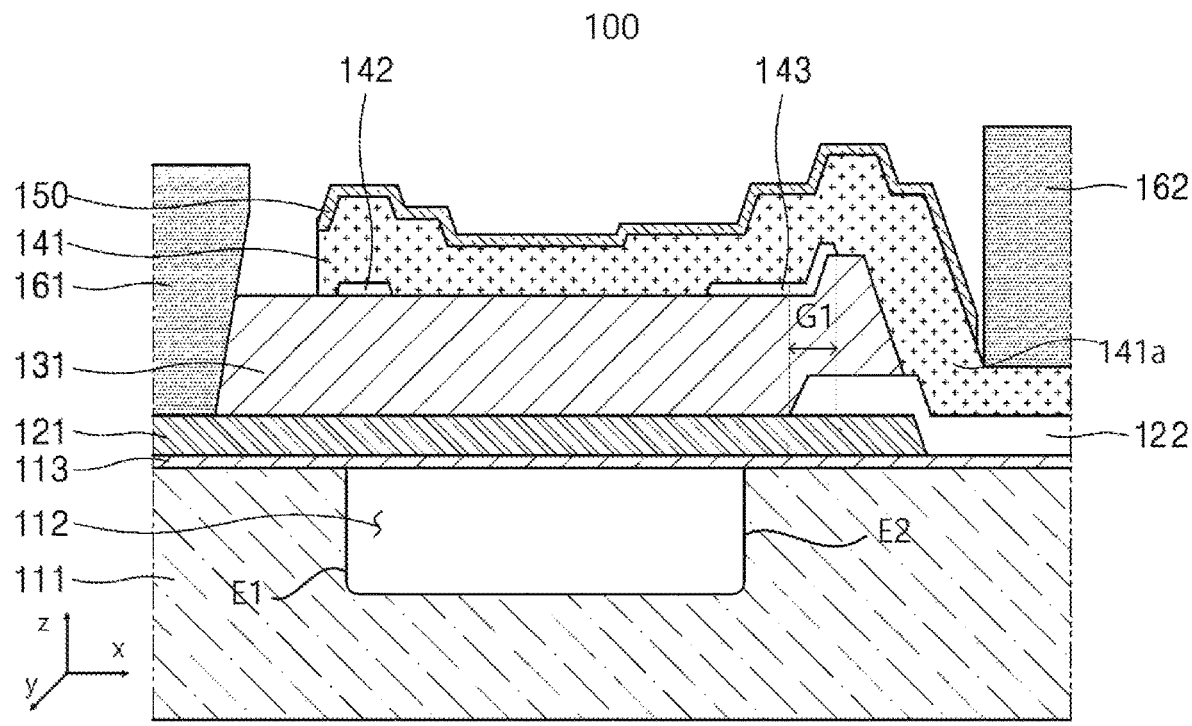
FIG. 2 is a cross-sectional view of the acoustic resonator according to the first embodiment of the present invention.

FIGS. 1 and 2 illustrate the acoustic resonator 100 according to a first embodiment of the present invention.

FIG. 1 is a top view of the acoustic resonator according to the first embodiment of the present invention.

FIG. 2 is a cross-sectional view of the acoustic resonator according to the first embodiment of the present invention.

Referring to FIGS. 1 and 2, a substrate 111, a first electrode (lower electrode) 121, a piezoelectric layer 131, and a second electrode (upper electrode) 141 which are included in the acoustic resonator 100 are illustrated.

Referring back to FIG. 2, the acoustic resonator 100 may include the substrate 111 including a first cavity 112, the first electrode 121 formed above the substrate 111, the piezoelectric layer 131 formed on one surface of the first electrode 121, and the second electrode 141 formed on one surface of the piezoelectric layer 131.

The first electrode 121 and the piezoelectric layer 131 may be formed to include an overlap area corresponding to one edge E1 to the other edge E2 of the first cavity 112. The first electrode 121 may have a longitudinal section outside the overlap area on the basis of the other edge E2 of the first cavity 112.

The piezoelectric layer 131 may have a longitudinal section outside the overlap area like the first electrode 121 not to cover the longitudinal section of the first electrode 121. That is, the piezoelectric layer 131 may be formed to be longitudinally cut at a position not to cover the longitudinal section of the first electrode 121.

The second electrode 141 may be formed above the first cavity 112 to include the overlap area, cover the longitudinal section of the piezoelectric layer 131, and extend to one or more interpolar cavities 122 or beyond, which are kept being spaced apart from the first electrode 121.

Referring to FIG. 2, a partial area of the first interpolar cavity 122 allows the first electrode 121 and the piezoelectric layer 131 to be at least partially spaced apart from each other. Also, a partial area of the first interpolar cavity 122 maintains a gap between the first electrode 121 and the second electrode 141. The second electrode 141 may be formed, for example, in a U-shape, to extend to a second part 131b of the piezoelectric layer 131 of FIG. 1 or beyond within a range without invading the first interpolar cavity 122.

Referring to FIG. 2, the second electrode 141 may include an extension area 141a which extends in a direction of the first electrode 121 according to a shape of the longitudinal section of the piezoelectric layer 131.

The first interpolar cavity 122 may cover the longitudinal section of the first electrode 121 and a part of the substrate 111, come into contact with a bottom surface where the second electrode 141 extends, and be formed between the first electrode 121 and the piezoelectric layer 131 outside the overlap area on the basis of the other edge of the first cavity 112. The first interpolar cavity 122 may prevent production of parasitic capacitance between the first electrode 121 and the second electrode 141.

The first interpolar cavity 122 may include air or a dielectric material. Also, a second cavity 142 formed below a wing area of the second electrode 141 and a third cavity 143 formed below a bridge area may include air or dielectric material. The first interpolar cavity 122 which is filled with a dielectric material is called a first spacer. Accordingly, above the one edge E1 and the other edge E2 of the first cavity 112, the second cavity 142, the third cavity 143, and the first interpolar cavity 122 which are filled with air may be formed. Since the first interpolar cavity 122 and the second cavity 142 may have a dielectric constant different from that of an adjacent medium, effects such as a decrease in electrical loss and an increase in a quality factor may be obtained.

The second electrode 141 may include the wing area including the second cavity 142 between the second electrode 141 and the piezoelectric layer 131 near the one edge of the overlap area. Also, the second electrode 141 may include the bridge area including the third cavity 143 between the second electrode 141 and the piezoelectric layer 131 near the other edge of the overlap area.

The third cavity 143 formed by the second electrode 141 and the first spacer 122 formed to cover the longitudinal section of the first electrode 121 may be formed to overlap each other by a gap G1.

The second electrode 141 may be thicker in the extension area than in the overlap area.

The second electrode 141 may have a thickness which extends in a V-shape or U-shape according to a shape of the longitudinal section of the piezoelectric layer 131.

Also, a first passivation layer 113 may be selectively formed between the substrate 111 and the first electrode 121, and a second passivation layer 150 may be formed on one surface of the second electrode 141.

Also, the acoustic resonator 100 may further include a first metal pattern layer 161 and a second metal pattern layer 162 which are called pads. That is, the acoustic resonator 100 may further include conductive metal pattern layers 161 and 162 which are formed above the first electrode 121 outside the overlap area on the basis of one edge of the first cavity 112.

Among a variety of substrate materials, the substrate 111 may be implemented using a semiconductor substrate. Particularly, a silicon wafer may be used. Exemplarily, a high-resistivity silicon substrate may be used.

The first cavity 112 may be formed in a partial area of the substrate 111. That is, the first cavity 112 may be formed in a trench form throughout the one edge E1 and the other edge E2 in an X-axis direction on one surface of the substrate 111, that is, in a partial area of an upper surface in FIG. 2. The first cavity 112 may be formed during a sacrificial layer forming process or through bonding of the preformed first electrode. The first cavity 112 may be filled with air or SiO2.

The first cavity 112 may function as a reflecting element, and a disposition thereof has a significant meaning in the acoustic resonator. Referring to FIG. 2 for the first cavity 112, a left side and a right side which form a width of the first cavity 112 will be referred to as the one edge E1 and the other edge E2, respectively. A modified structure of the second electrode 141, in addition to the first electrode 121, the piezoelectric layer 131, and the second electrode 141 which form the overlap area, has a correlation with the first cavity 112 which has the width formed by the one edge and the other edge.

The first cavity 112 may be formed by forming a trench area on one surface of the substrate 111, forming an insulating layer in the trench area, depositing, etching, and planarizing a sacrificial layer above the insulating layer, and then removing the sacrificial layer. Also, a spatial area of the first cavity 112 may be formed and a preformed first electrode may be bonded to a top thereof.

As a material of the sacrificial layer, materials such as polysilicon, tetraethyl orthosilicate (TEOS), phosphosilicate glass (PSG), and the like, which have excellent surface roughness and are easily formed or removed, may be used. As an example, polysilicon which has high surface roughness and is easily formed or removed may be used as the sacrificial layer, and particularly, may be removed using dry etching in a following process.

While the sacrificial layer of the overlap area of the first cavity 112 is not removed, the first passivation layer 113 which covers the sacrificial layer and the surface of the substrate 111 may be selectively formed. In order to implement the first passivation layer 113, a thermally oxidized film capable of easily growing on the substrate 111 may be employed or an oxide film or a nitride film which is formed using a general deposition process such as chemical vapor deposition and the like may be selectively employed.

The first electrode 121 may be formed on one surface of the substrate 111. That is, when there is no the first passivation layer 113, the first electrode 121 may be suspended above the first cavity 112 and cover an entirety or part of the substrate 111 where the first cavity 112 is not present. FIG. 2 illustrates the first electrode 121 formed to cover the first cavity 112 and cover a partial area of the substrate 111. The first electrode 121 may be formed to be longitudinally cut at an outer area of the first cavity 112 on the basis of the other edge E2 of the first cavity 112. Referring to FIG. 2, an edge of a longitudinal section area of the first electrode 121 may be finished with a downward slope.

The first electrode 121 and the second electrode 141 correspond to an input terminal and an output terminal for electrical signals, respectively. The first electrode 121 may be implemented as a conductor material.

The first electrode 121 may be formed above the first passivation layer 113 or the substrate 111. When a sacrificial layer is present in a first cavity area of the substrate 111, the first electrode 121 may be formed above the sacrificial layer.

The first electrode 121 may be formed by depositing and then patterning a certain material on one surface of the substrate 111. As a material of the first electrode 121, a general conductor such as a metal, and particularly, one of aluminum (Al), tungsten (W), gold (Au), platinum (Pt), nickel (Ni), titanium (Ti), chrome (Cr), palladium (Pd), ruthenium (Ru), rhenium (Re), and molybdenum (Mo) may be used. The first electrode 121 may have a thickness within a range of 10 to 1000 nm.

The piezoelectric layer 131 may be formed on one of both surfaces of the first electrode 121 which is opposite a surface where the first electrode 121 comes into contact with the substrate 111. The piezoelectric layer 131 formed on the first electrode 121 may be formed not to cover a partial area of the first electrode 121. For example, referring to FIG. 2, the first metal pattern layer 161 may be formed in a partial area of the first electrode 121 which is exposed and not covered by the piezoelectric layer 131.

Also, the piezoelectric layer 131 may be longitudinally cut along the longitudinal section of the first electrode 121 and thus an inclined edge may be formed. Accordingly, the piezoelectric layer 131 may be formed not to cover the edge of the first electrode 121 which is longitudinally cut.

The piezoelectric layer 131 may include a piezoelectric element and is named after the element. When an electrical signal is applied between the first electrode 121 and the second electrode 141, the piezoelectric layer 131 generates an acoustic wave due to a piezoelectric material.

The piezoelectric layer 131 may be formed by depositing and patterning a piezoelectric material on one of both surfaces of the first electrode 121 which is opposite a surface where the first electrode 121 comes into contact with the substrate 111. As the piezoelectric material of the piezoelectric layer 131, aluminum nitride (AlN) or zinc oxide (ZnO) may be used. As a deposition method, a radio frequency (RF) magnetron sputtering method, evaporation method, and the like may be used. The piezoelectric layer 131 may have a thickness within a range of 5 to 500 nm.

The first electrode 121 and the second electrode 141 correspond to an input terminal and an output terminal for electrical signals, respectively. The second electrode 141 may be implemented as a conductor material.

The second electrode 141 may be formed by depositing and patterning a metal film for an electrode in a certain area on one surface of the substrate 131. The second electrode 141 may be formed using the material, deposition method, and patterning method which are used for the first electrode 121. The second electrode 141 may have a thickness within a range of 5 to 1000 nm.

As a material of the second electrode 141, a general conductor such as a metal, and particularly, one of Al, W, Au, Pt, Ni, Ti, Cr, Pd, Ru, Re, and Mo may be used.

When an electrical signal is input to the acoustic resonator 100 through the first electrode 121 and the second electrode 141, part of input electrical energy is converted into mechanical energy according to the piezoelectric effect and the mechanical energy is converted into electrical energy. In this process, a resonance occurs with respect to a natural frequency according to the thickness of the piezoelectric layer 131.

The acoustic resonator 100 according to one embodiment of the present invention may include an active area where the first electrode, a planar area of the second electrode, and the piezoelectric layer 131 are overlapped in common. Also, the substrate 111 may be formed to have the first cavity 112 between the substrate 111 and the first electrode 121 which corresponds to a reflective area overlapped with the active area. That is, the first cavity 112 may be overlapped with the active area thereabove and formed between the first electrode 121 and the substrate 111.

Above the one edge of the first cavity 112 overlapped with the active area, the wing area of the second electrode 141 and the second cavity 142 formed thereby are arranged. Above the other edge of the first cavity 112, the bridge area of the second electrode 141 and the third cavity 143 formed thereby may be arranged.

The active area may be distributed over the area where the first electrode 121, the piezoelectric layer 131, and the planar area of the second electrode 141 are overlapped in common. The wing area of the second electrode may be disposed on one edge of the active area, and the bridge area of the second electrode may be disposed on the other edge thereof.

When the first electrode 121 deviates from the overlap area, that is, the active area and is longitudinally cut, the piezoelectric layer 131 may be formed to be longitudinally cut corresponding thereto. Accordingly, the area where the piezoelectric layer 131 does not cover the edge of the first electrode 121 may be formed.

Among a variety of functions of the active area, heat generated in the active area may be transferred to the substrate 111.

As mobile communications further develop, a using frequency band increases. Accordingly, a filter gradually decreases in size and a thickness thereof decreases. As disadvantages of thin films, a structure-related mechanic problem, a conducting-related electrical problem, and heat-transfer-related thermodynamic problem have been pointed out.

As the thermodynamic problem, electrodes of a filter which processes a radio frequency use a lot of power and the quantity of electric charge rapidly increases, and thus a heat generation rate increases. Also, as the electrical problem, based on Ohm's law, electrical resistances of electrodes increase according to the thin-filmed filter.

As a method of compensating an increase in electrical losses of electrodes, based on Ohm's law, a method of reinforcing thicknesses of electrodes may be considered.

The acoustic resonator 100 according to one embodiment of the present invention is a structure for compensating an electrical loss among the above variety of problems and may include an area where the second electrode 141 has a reinforced thickness. That is, the second electrode 141 may be formed to include an extension area with a greater thickness than that in the overlap area at a position adjacent to at least any one of the one edge E1 and the other edge E2 of the overlap area, that is, the active area.

The wing area may be disposed above one edge of the overlap area, that is, the active area, that is, above the one edge of the first cavity 112. The second electrode 141 of the wing area may be formed to have the second cavity 142 between the second electrode 141 and the piezoelectric layer 131. Also, an upper surface of the second electrode 141 of the wing area may deviate and have a reinforced thickness. The one edge and the other edge of the wing area may come into contact with the piezoelectric layer 131 so as to form the second cavity 142 may be closed. The second cavity 142 may be filled with a spacer or air.

The second electrode 141 may be formed to include the bridge area extending from the outside of the overlap area on the basis of the other edge of the active area, that is, the overlap area. Also, the bridge area of the second electrode 141 may be formed to have the third cavity 143 between the second electrode 141 and the piezoelectric layer 131. That is, due to the bridge area of the second electrode, the third cavity 143 may be formed between the piezoelectric layer 131 and the second electrode 141.

To form the third cavity 143, it is necessary to separate the second electrode 141 and the piezoelectric layer 131 from each other in a partial area. A structure appropriate for forming a separate state is a bridge-shaped structure.

The third cavity 143 may be formed to be closed like the second cavity 142. The third cavity 143 may also be filled with a spacer or air.

The third cavity 143 may be formed in one surface of the piezoelectric layer 131, and another cavity may be formed in the longitudinal section of the piezoelectric layer 131 according to a second embodiment. Also, in third and fourth embodiments, according to extension of the second electrode, the third cavity 143 may be connected to the cavity formed in the longitudinal section of the piezoelectric layer 131 so as to extend, including the longitudinal section of the first electrode 121, to a longitudinal section of a second part of the separated piezoelectric layer 131.

The third cavity 143 may have a height which is half or less than the thickness of the piezoelectric layer 131. Since the third cavity 143 is formed, the piezoelectric layer 131 may have different thicknesses in respective areas. Since the third cavity 143 has the height half or less than the thickness of the piezoelectric layer 131, a minimum thickness which allows heat generated thereinside to easily discharge may be secured. Also, the third cavity 143 may have a width in a lateral direction which is a quarter or more of an energy wavelength discharged through the piezoelectric layer 131.

The third cavity 143 may be formed by depositing, planarizing, etching and patterning a sacrificial layer above the piezoelectric layer 131, stacking the second electrode 141 above the piezoelectric layer 131 including other parts of the sacrificial layer, and then removing the sacrificial layer. In this case, a cavity portion may be formed in a partial area above the piezoelectric layer 131 and then the sacrificial layer may be deposited.

Here, as a material of the sacrificial layer, materials such as polysilicon, TEOS, PSG, and the like, which have excellent surface roughness and are easily formed or removed, may be used. A process of forming the third cavity 143 may be applied to the second cavity 142.

The acoustic resonator 100 according to one embodiment of the present invention may further include the first metal pattern layer 161 which is conductive and formed to cover an edge formed by the longitudinal section of the piezoelectric layer 131 in an area where the piezoelectric layer 131 is longitudinally cut and thus the first electrode 121 is exposed.

Also, the acoustic resonator 100 according to one embodiment of the present invention may further include the second metal pattern layer 162 formed in an area where the second passivation layer 150 is longitudinally cut and thus the second electrode 141 is exposed.

The metal pattern layers 161 and 162 according to one embodiment of the present invention may be disposed to be as close as possible to the active area. Through the disposition close to the active area, the electrical losses of the first electrode 121 and the second electrode 141 may be reduced.

The metal pattern layers 161 and 162 correspond to metal pads to which a signal line of an external circuit device connected to the first electrode 121 and the second electrode 141 is connected. One edges of the metal pattern layers 161 and 162 may be formed to be inclined to have uniform thicknesses to correspond to a shape of the one edge of the piezoelectric layer 131.

The metal pattern layers 161 and 162 may be formed of conductive metal at positions out of the active area. The metal which forms the metal pattern layers 161 and 162 includes Au, copper (Cu), Al, an aluminum copper alloy (AlCu), and the like. Since the metal pattern layers 161 and 162 are formed, a quality factor may be increased.

Figure 3:
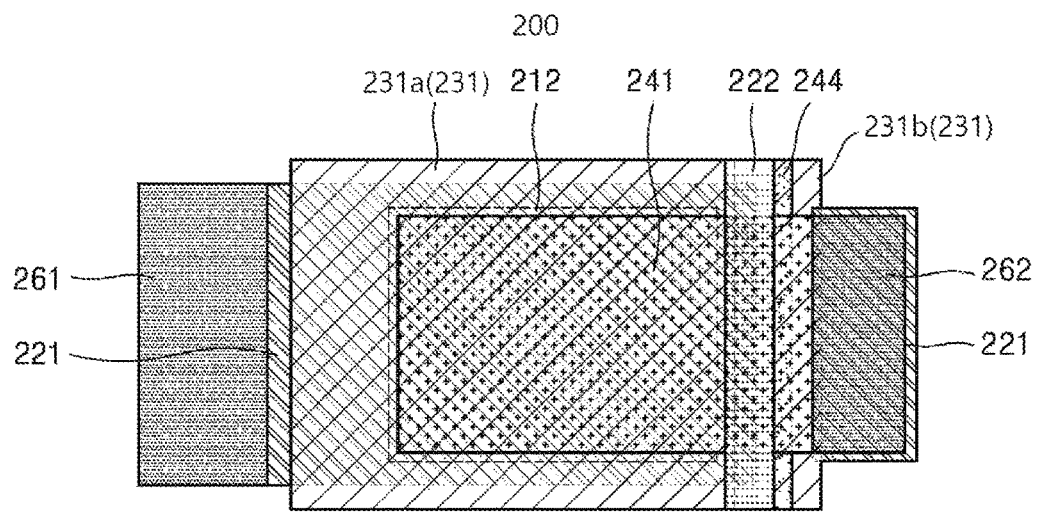
FIG. 3 is a top view of an acoustic resonator according to a second embodiment of the present invention.
Figure 4:
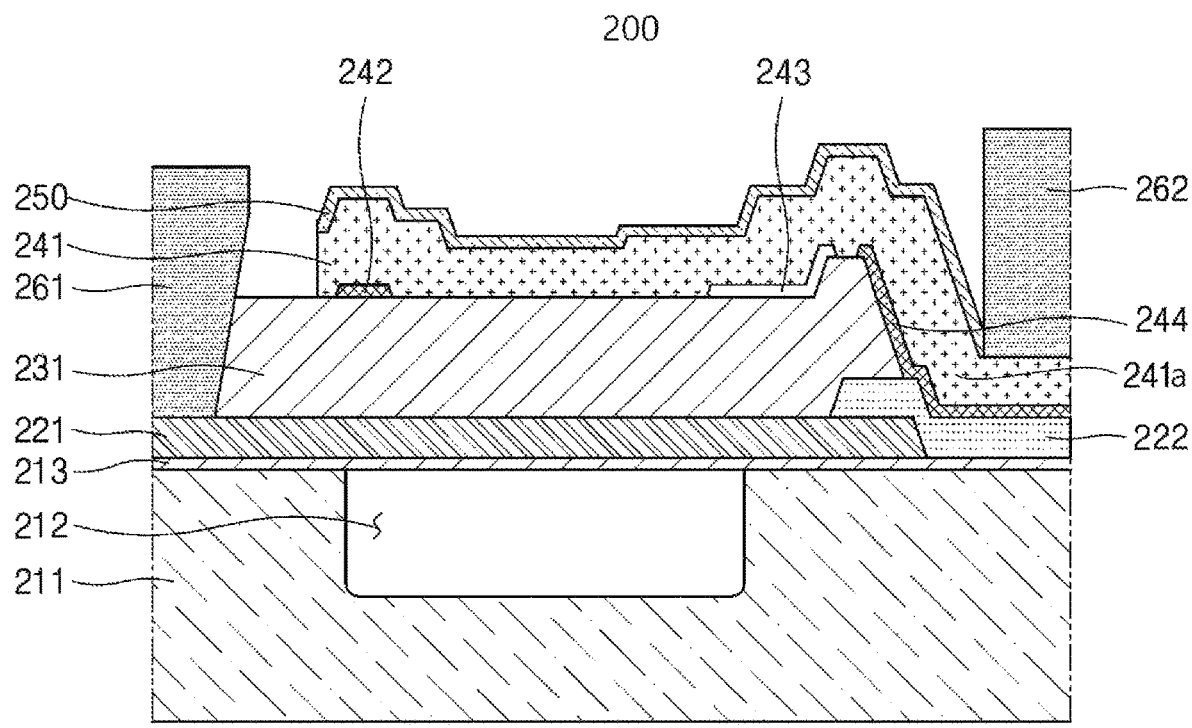
FIG. 4 is a cross-sectional view of the acoustic resonator according to the second embodiment of the present invention.

FIGS. 3 and 4 illustrate the second embodiment of the present invention.

FIG. 3 is a top view of an acoustic resonator according to the second embodiment of the present invention.

FIG. 4 is a cross-sectional view of the acoustic resonator according to the second embodiment of the present invention.

A second electrode 241 may include a wing area for forming a second cavity 242 near one edge E1 of an overlap area with a first cavity 212, a bridge area for forming a third cavity 243 near the other edge E2, and an extension area 241a.

The extension area 241a may be overlapped with a longitudinal section of a first electrode 221 outside the overlap area on the basis of the other edge E2.

On the basis of the acoustic resonator 200 according to the second embodiment shown in FIG. 4, the acoustic resonator 200 may further include a second interpolar cavity 244 which has one surface coming into contact with the second electrode 241, has the other surface coming into contact with a longitudinal section of a piezoelectric layer 231, and comes into contact with a first interpolar cavity 222.

When the first interpolar cavity 222 covers the longitudinal section of the first electrode 221, the second interpolar cavity 244 may be formed to cover the longitudinal section of the piezoelectric layer. The first interpolar cavity 222 and the second interpolar cavity 244 may be overlapped with each other between the first electrode 221 and the second electrode 241.

Referring to FIG. 4, the second interpolar cavity 244 may be formed to come into contact with the longitudinal section of the piezoelectric layer 231, a lower surface of the second electrode 241, and part of an upper surface of the first interpolar cavity 222. The second interpolar cavity 244 may supplement a function of the first interpolar cavity 222, that is, a function of preventing production of parasitic capacitance between the first electrode 221 and the second electrode 241.

Meanwhile, at least one of the second cavity 242, the third cavity 243, the first interpolar cavity 222, and the second interpolar cavity 244 may be filled with air or a dielectric material.

Figure 5:
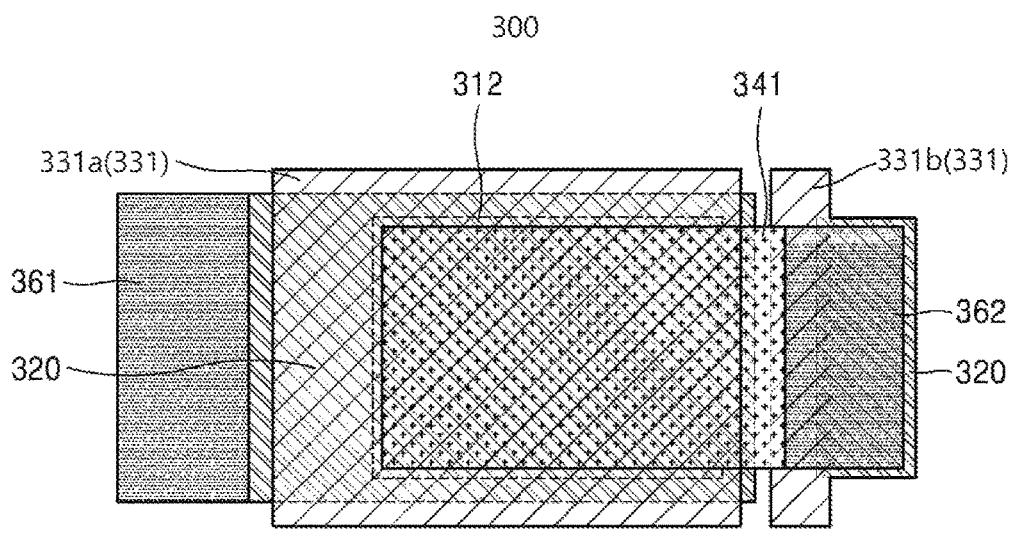
FIG. 5 is a top view of an acoustic resonator according to a third or fourth embodiment of the present invention.

FIG. 5 is a top view of an acoustic resonator according to a third embodiment of the present invention.

Figure 6:
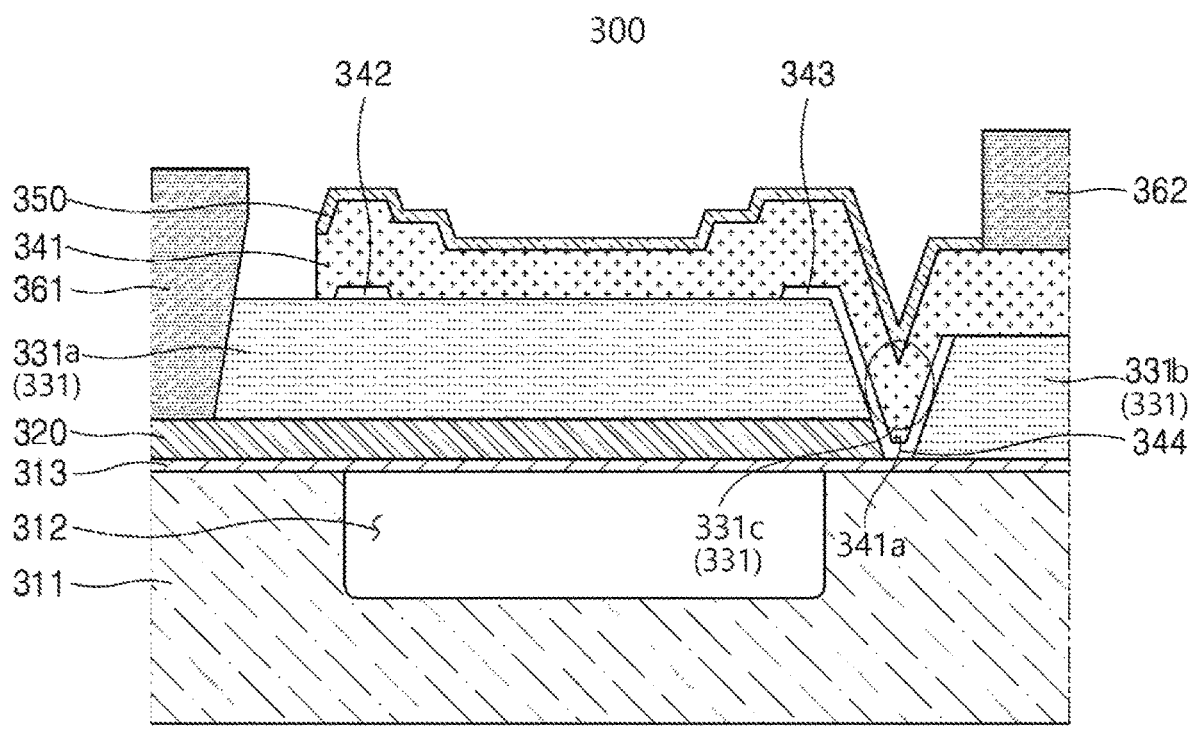
FIG. 6 is a cross-sectional view of the acoustic resonator according to the third embodiment of the present invention.

FIG. 6 is a cross-sectional view of the acoustic resonator according to the third embodiment of the present invention.

Referring to FIGS. 5 and 6, an acoustic resonator 300 according to the third embodiment of the present invention may include a substrate 311 including a first cavity 312, a first electrode 320 formed above the substrate 311, piezoelectric layers 331a and 331b formed on one surface of the first electrode 320, and a second electrode 341 formed on one surfaces of the piezoelectric layers 331a and 331b.

Also, the first electrode 320 and the piezoelectric layers 331a and 331b include an overlap area corresponding to one edge to the other edge of the first cavity 312. The first electrode 320 includes a longitudinal section outside the overlap area on the basis of the other edge of the first cavity 312. The piezoelectric layers 331a and 331b may include longitudinal sections at a first part 331a to which the overlap area belongs and a second part 331b which does not come into contact with the first electrode 320 due to a valley-shaped etching area 331c formed thereabove.

The second electrode 341 may be overlapped with the first cavity 312 and formed above the etching area 331c along a valley shape.

The piezoelectric layers 331a and 331b may be etched in an outer area on the basis of the other edge E2 of the overlap area to have a valley shape. That is, the piezoelectric layers 331a and 331b may be divided into the first part 331a and the second part 331b with the etching area therebetween. The first part 331a and the second part 331b may be completely separated as shown in FIG. 6 or only lower areas thereof may be connected to each other.

The second electrode 341 may extend toward the first electrode 320 along a shape of longitudinal sections of the first part 331 a and the second part 331 b of the piezoelectric layers. The second electrode 341 may extend in a V-shape or U-shape according to curvature.

Also, the first part 331a and the second part 331b of the piezoelectric layer 331 may have different heights depending on a longitudinal section of the first electrode 320.

Figure 7:
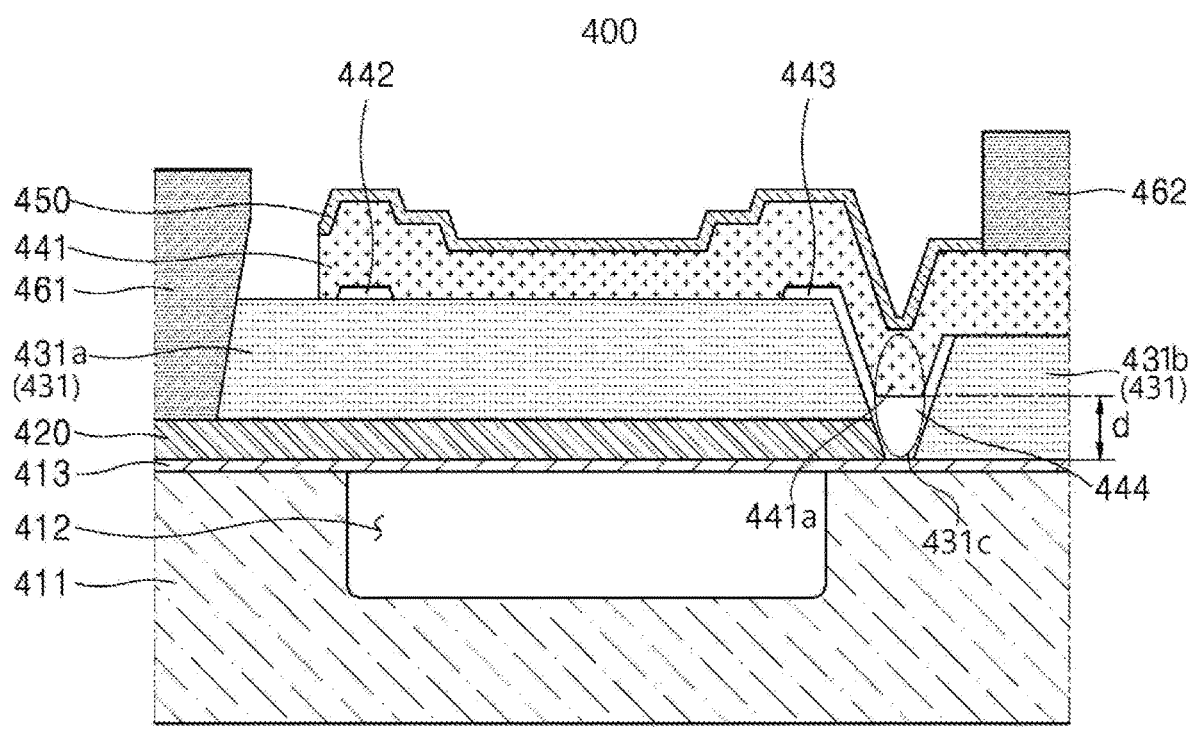
FIG. 7 is a cross-sectional view of the acoustic resonator according to the fourth embodiment of the present invention.

FIG. 7 is a cross-sectional view of an acoustic resonator according to a fourth embodiment of the present invention.

Referring to FIG. 7, a second electrode 441 may have a longitudinal section on each of a first part 431a and a second part 431b of a piezoelectric layer 431 which are separated by an etching area 431c outside an overlap area on the basis of the other edge E2 of the overlap area.

An acoustic resonator 400 according to the fourth embodiment of the present invention includes a fourth cavity 444 at a position parallel to a longitudinal section of a first electrode 420 in comparison to the third embodiment.

A space for the fourth cavity 444 which is adequately capable of suppressing the occurrence of parasitic capacitance may be secured due to a height difference between a lowermost surface of an extension area 441a of the second electrode 441 and a lowermost surface of the first electrode 420. The fourth cavity 444 may be formed at the same height as that of the first electrode 420 which is longitudinally cut.

To form the fourth cavity 444, a sacrificial layer may be formed in addition to a sacrificial layer for a second cavity 442 and a third cavity 443.

Referring back to FIG. 6, as described above, the second electrode 341 may include a wing area, a bridge area, and an extension area connected to the bridge area and having a lowermost surface lower than the first part 331a of the piezoelectric layer and an upper surface of the first electrode 320. Here, the bridge area and the extension area may be formed to have shapes similar to a crest and a trough of a fold.

That is, an extension area 341a of the second electrode 341 may be formed to invade, by at least a partial thickness, a virtual first electrode extending from the first electrode 320 which is longitudinally cut. That is, a height of the lowermost surface of the second electrode 341 in the extension area 341a may be lower than a height of an uppermost surface of the first electrode 320.

When the bridge area and the extension area 341a are compared with a stratum, the bridge area and a third downward area of the second electrode 341 may have structures as those of a crest and a trough of a fold and a hinge of the trough may be lower than one surface of the first electrode 320.

The extension area 341a of the second electrode 341 may include a fourth cavity 344 between the extension area 341a and an edge of the first electrode 320 which is longitudinally cut without invading the virtual first electrode extending from the first electrode 320 which is longitudinally cut.

The second electrode 341 may further include the extension area 341a extending by an acute angle to have a V-shape or U-shape. A third cavity 343 may extend according to extending of the second electrode 341.

Since the resistance of the second electrode 341 having a reinforced thickness at a position out of an active area is reduced, currents are collected at the edge of the electrode and flow to an electrode lead and thus a quality factor may increase. That is, since the resistance is reduced in a reinforced area of the second electrode 341, a flow rate of charge per unit time may increase.

Also, heat condensed in the active area may be transferred to the outside through the substrate 311.

In addition, heat generated in the active area is transferred to the substrate by compensating a thickness of the first electrode 320 and thus heat transfer may be improved.

Referring back to FIG. 6, the acoustic resonator 300 may include a second passivation layer 350. The second passivation layer 350 may be formed on a surface opposite to a surface of the second electrode 341 which comes into contact with the piezoelectric layer 331. A trench may be formed in a partial area of the opposite surface of the second passivation layer 350.

The second passivation layer 350 may perform a passivation function for protecting the first electrode 320, the piezoelectric layer 331, and the second electrode 341. The second passivation layer 350 may have one edge which coincides with one edge of the second electrode 341 as shown in FIG. 6.

The technical features included in the acoustic resonator 100 according to one embodiment of the present invention may be implemented by a manufacturing method. Since a detailed process of manufacturing the acoustic resonator 100 has been described above, the features will be described in brief.

Figure 8:
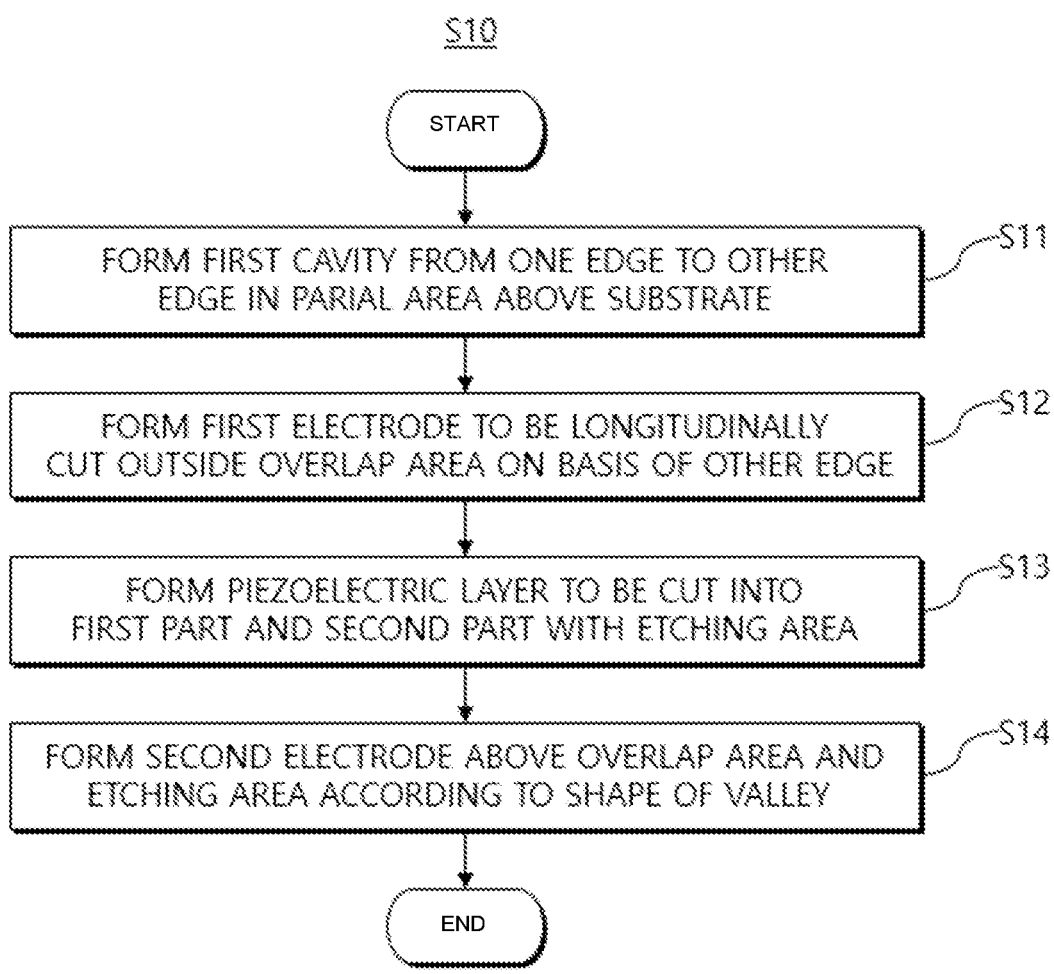
FIG. 8 is a flowchart illustrating a method of manufacturing an acoustic resonator according to one embodiment of the present invention.

FIG. 8 is a flowchart illustrating a method (S10) of manufacturing the acoustic resonator 100 according to one embodiment of the present invention.

Referring to FIGS. 2 and 8, the method (S10) of manufacturing the acoustic resonator may include forming the first cavity 112 in a partial area above the substrate 111 (S11), forming the first electrode 121 to be longitudinally cut outside an overlap area on the basis of the other edge E2 of the overlap area (S12), forming the piezoelectric layer 131 to be cut into the first part 131a and the second part 131b with a valley-shaped etching area (S13), and forming the second electrode 141 along a valley shape above the overlap area and the etching area.

The first cavity 112 may be formed in the partial area above the substrate 111 to have a trench form (S11). The first cavity 112 may be formed to have a width from one edge E1 to the other edge E2.

The first electrode 121 may be formed above the substrate 111 including the first passivation layer 112. That is, the first electrode 121 may be formed on an upper surface of the substrate 111 when the first passivation layer 113 is not present, and may be formed above the first passivation layer 113 when the first passivation layer 113 is present above the substrate 111.

The first electrode 121 may include an overlap area corresponding to the one edge E1 to the other edge E2 of the first cavity 112. Also, the first electrode 121 may be formed to be longitudinally cut outside the overlap area on the basis of the other edge E2 of the overlap area.

The piezoelectric layer 131 may be formed on one surface of the first electrode to be longitudinally cut outside the overlap area like the first electrode 121. However, the piezoelectric layer 131 may be formed to be longitudinally cut before the first electrode 121 not to cover a longitudinal section of the first electrode 121.

The second electrode 141 may extend toward the first electrode 121 along a longitudinal section of the piezoelectric layer 131.

Hereinafter, to distinguish features in methods of manufacturing an acoustic resonator according to respective embodiments, parts related to the features will be described.

Figure 9:
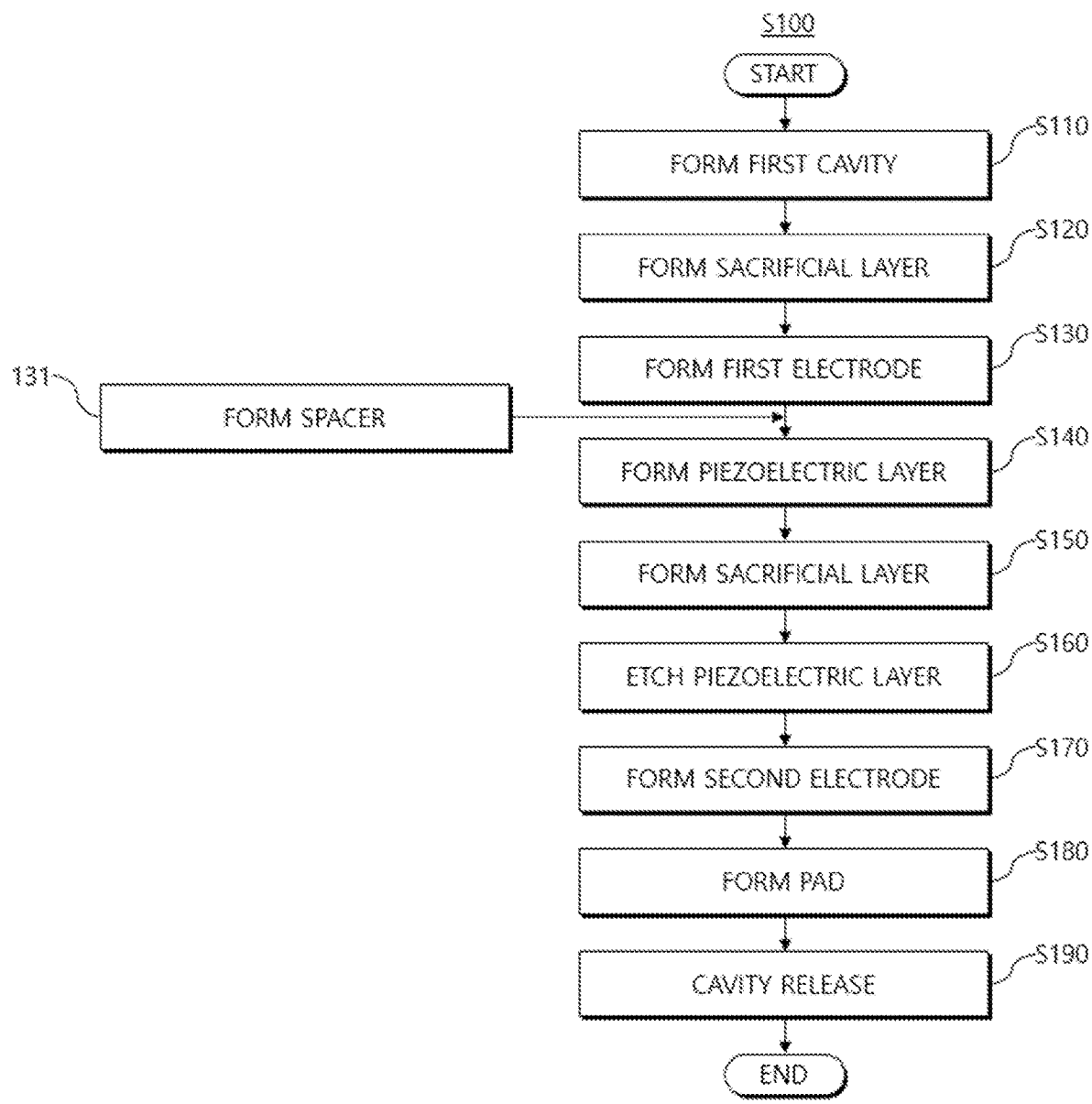
FIG. 9 is a flowchart illustrating a method of manufacturing an acoustic resonator according to a first embodiment of the present invention.

FIG. 9 is a flowchart illustrating a method of manufacturing an acoustic resonator according to a first embodiment of the present invention.

Referring to FIG. 9, a method (S100) of manufacturing the acoustic resonator according to the first embodiment of the present invention may include forming a first cavity (S110), forming a sacrificial layer (S120), forming a first electrode (S130), forming a spacer (S131), forming a piezoelectric layer (S140), forming a sacrificial layer (S150), etching the piezoelectric layer (S160), forming a second electrode (S170), forming a pad (S180), and cavity release (S190).

Referring to FIGS. 2 and 9, the method (S100) of manufacturing the acoustic resonator according to the first embodiment of the present invention may include forming a first spacer 122 of the first interpolar cavity to cover an edge area of the first electrode 121 which is longitudinally cut (S131).

After the piezoelectric layer 131 is formed (S140), the sacrificial layer for forming the second cavity 142 and the third cavity 143 may be formed (S150).

The piezoelectric layer 131, like the first electrode 121, may be longitudinally cut in the etching of the piezoelectric layer (S160) not to cover the edge of the first electrode 121 which is longitudinally cut. A longitudinal section of the piezoelectric layer 131 may be formed to be a slope.

The second electrode 141 may extend toward the first electrode 121 along a longitudinal section of the piezoelectric layer 131 (S170).

When the first spacer 122 is removed through the cavity release (S190), a first interpolar cavity may be formed at a position of the first spacer.

The third cavity 143 and the first spacer 122 or a filling gas such as air and the like of the first interpolar cavity may be formed to be overlapped with each other by a gap G1 in an outer area on the basis of the other edge E2 of the first cavity 112. The third cavity 143 above the gap G1 and the first interpolar cavity 122 are overlapped with each other and thus a quality factor in the active area may increase.

Figure 10:
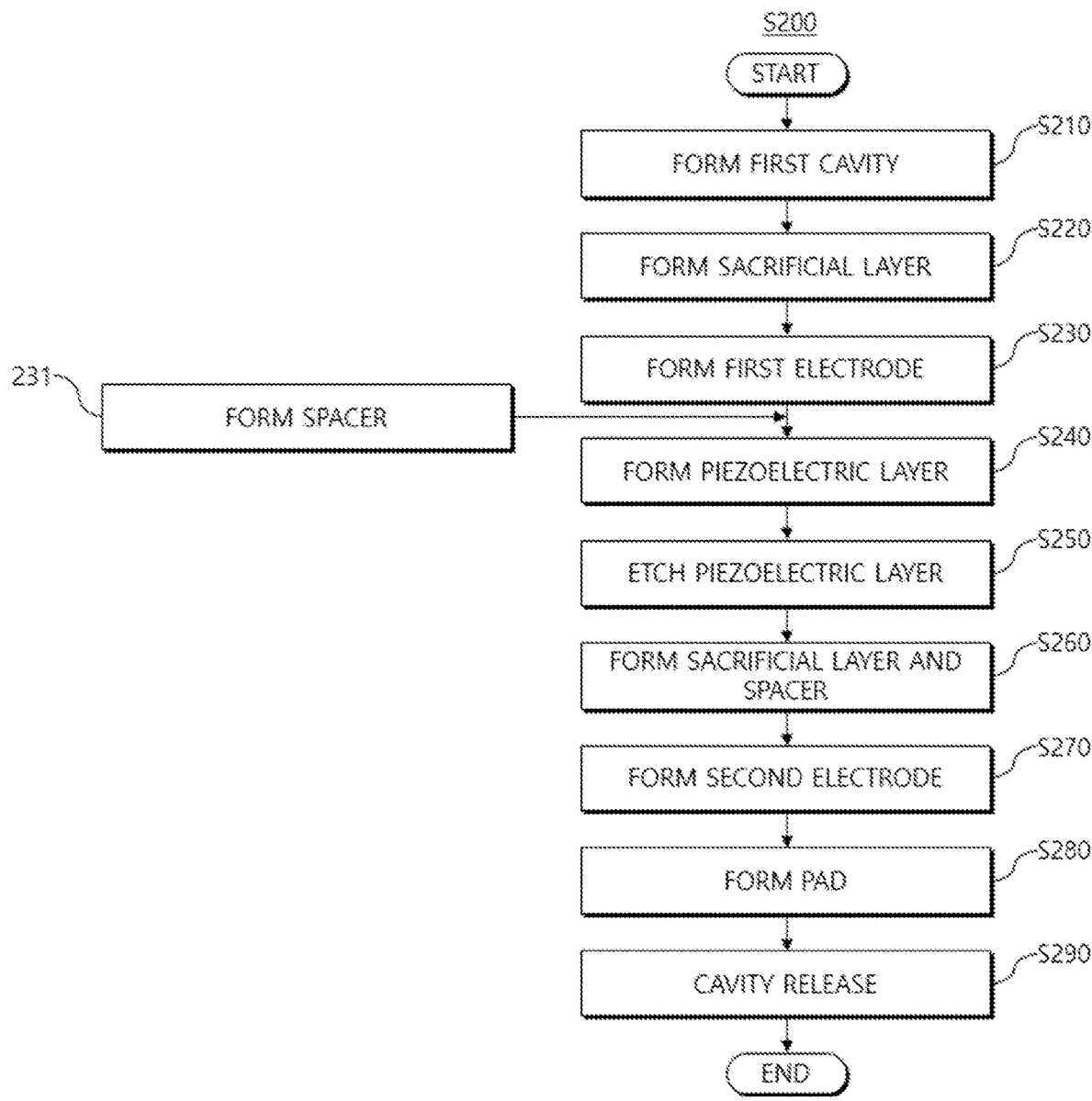
FIG. 10 is a flowchart illustrating a method of manufacturing an acoustic resonator according to a second embodiment of the present invention.

FIG. 10 is a flowchart illustrating a method of manufacturing an acoustic resonator according to a second embodiment of the present invention.

Referring to FIG. 10, a method (S200) of manufacturing the acoustic resonator according to the second embodiment of the present invention may include forming a first cavity (S210), forming a sacrificial layer (S220), forming a first electrode (S230), forming a spacer (S231), forming a piezoelectric layer (S240), etching the piezoelectric layer (S250), forming a sacrificial layer and a spacer (S260), forming a second electrode (S270), forming a pad (S280), and cavity release (S290).

According to the second embodiment of the present invention, a second sacrificial layer and a second interpolar cavity 244 may be formed above the piezoelectric layer 231 (S260). The second interpolar cavity 244 is filled with a dielectric material and is called a second spacer 244. The second spacer 244 of the second interpolar cavity 244 is formed to come into contact with the second electrode 241 and reduces an electrical loss of the second electrode 241 due to a dielectric constant of a dielectric material.

Figure 11:
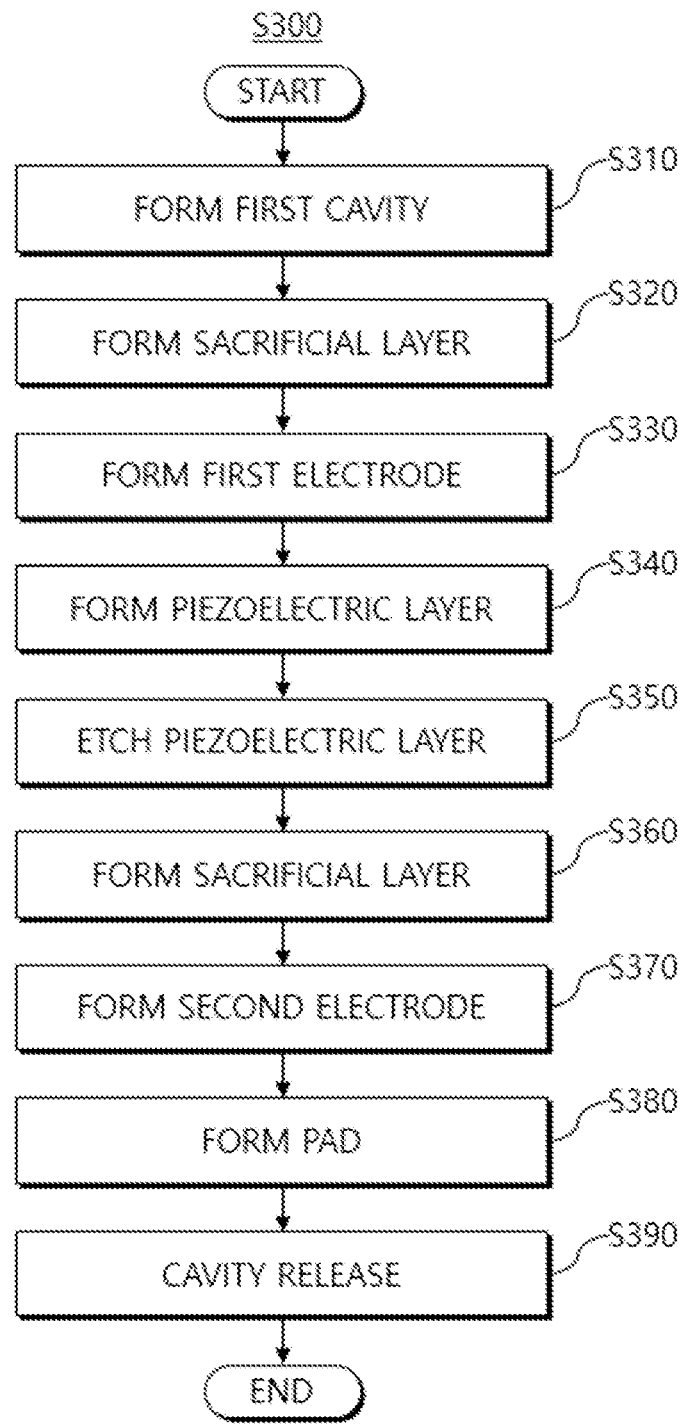
FIG. 11 is a flowchart illustrating a method of manufacturing an acoustic resonator according to a third embodiment of the present invention.

FIG. 11 is a flowchart illustrating a method of manufacturing an acoustic resonator according to a third embodiment of the present invention.

Referring to FIG. 11, a method (S300) of manufacturing the acoustic resonator according to the third embodiment of the present invention may include forming the first cavity 312 (S310), forming a sacrificial layer (S320), forming the first electrode 320 (S330), forming the piezoelectric layer 331 (S340), etching the piezoelectric layer 331 (S350), forming a sacrificial layer (S360), forming the second electrode 341 (S370), forming pads 361 and 362 corresponding to metal pattern layers (S380), and cavity release (S390).

The piezoelectric layer 331 according to the third embodiment of the present invention may include a first part to which an overlap area belongs due to a valley-shaped etching area formed thereabove and a second part which does not come into contact with the first electrode (S350).

The method of manufacturing the acoustic resonator according to the third embodiment of the present invention may include forming the sacrificial area for forming cavities between the piezoelectric layer 331 and a wing area and a bridge area of the second electrode 341, respectively (S360).

The second area 341 may include the extension area 341*a* formed to invade, by at least a partial thickness, a virtual piezoelectric layer extending from the piezoelectric layer 331 which is longitudinally cut. The extension area 341*a* has a shape similar to a crest and a trough of a fold of a stratum (S370).

Figure 12:
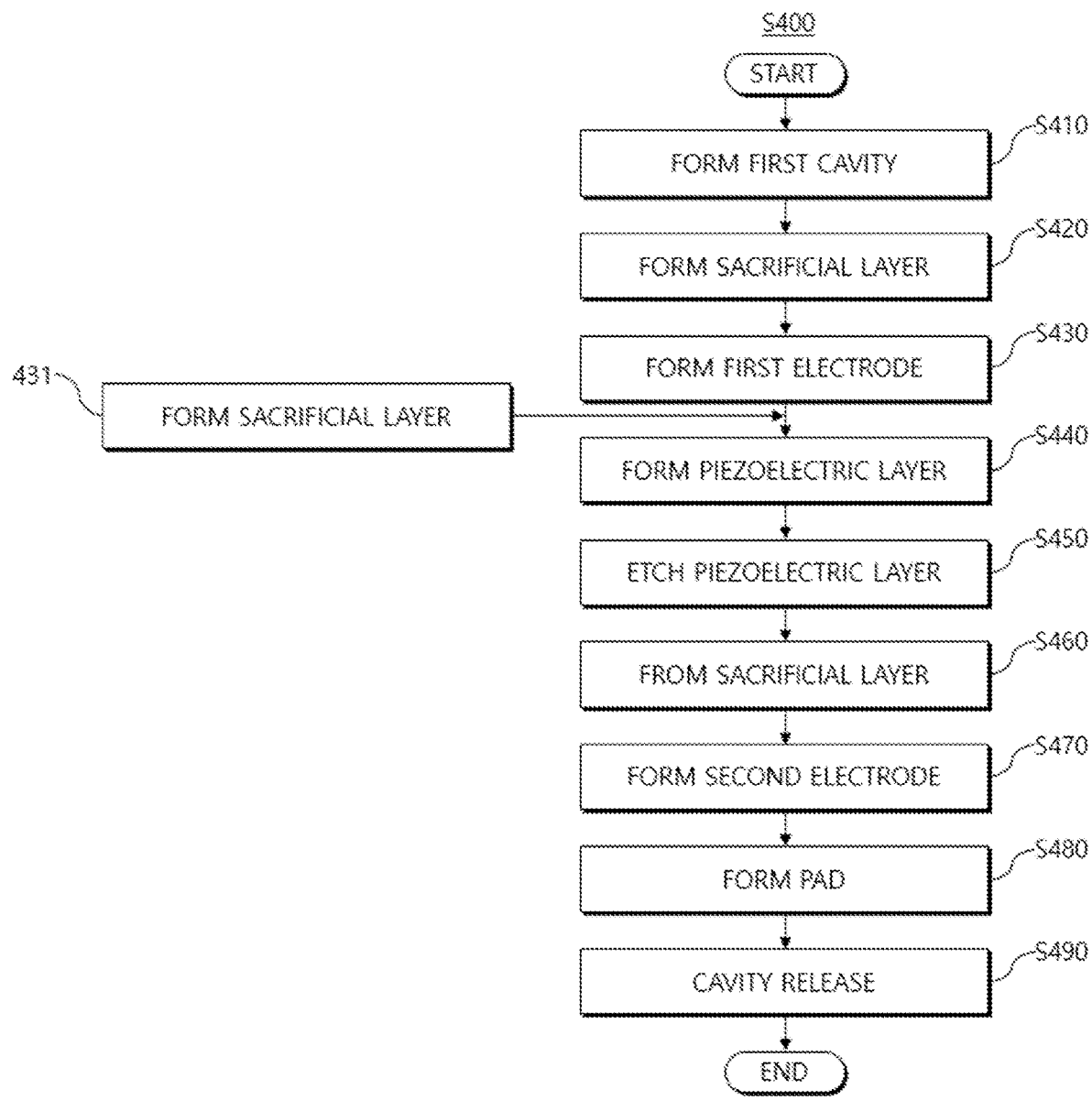
FIG. 12 is a flowchart illustrating a method of manufacturing an acoustic resonator according to a fourth embodiment of the present invention.

FIG. 12 is a flowchart illustrating a method of manufacturing an acoustic resonator according to a fourth embodiment of the present invention.

Referring to FIG. 12, a method (S400) of manufacturing the acoustic resonator according to the fourth embodiment of the present invention may include forming a first cavity (S410), forming a sacrificial layer (S420), forming a first electrode (S430), forming a sacrificial layer (S431), forming a piezoelectric layer (S440), etching the piezoelectric layer (S450), forming a sacrificial layer (S460), forming a second electrode (S470), forming a pad (S480), and cavity release (S490).

According to the fourth embodiment of the present invention, as shown in FIG. 7, a second sacrificial layer may be formed to form the fourth cavity 444 corresponding to a height difference d between the first electrode 420 and the second electrode 441 on the basis of a lowermost surface (S431). The fourth cavity 444 may be formed among a longitudinal section of the first electrode 420, the second electrode 441, and the second part 431*b* of the piezoelectric layer.

After the second sacrificial layer is formed, the piezoelectric layer is formed and then etched. The piezoelectric layer 431 may be separated into the first part 431*a* and the second part 431*b* with a valley-shaped etching area therebetween.

The second electrode 441 may include the second cavity 442 formed by a wing area near one edge of the first cavity 412 and the third cavity 443 formed by a bridge area near the other edge thereof.

Also, the second electrode 441 may extend in a V-shape or U-shape toward the first electrode 420 above an etching area along a shape of the valley-shaped piezoelectric layer 431 (S470).

The first cavity 412, the second cavity 442, the third cavity 443, and the fourth cavity 444 which are included in the substrate 111 may be implemented through the cavity release (S490). Particularly, the third cavity 443 and the fourth cavity 444 which have extended may suppress the occurrence of parasitic capacitance between the first electrode 420 and the second electrode 441 which come close to each other.

The acoustic resonator 100 according to one embodiment of the present invention may reduce electrical losses of electrodes by disposing the metal pattern layers 161 and 162 and reinforcing the thickness of the second electrode 141.

Also, a quality factor may be increased by locking up lateral waves which escape from an active area, that is, an overlap area of the second electrode 141 using a resonance formed by a wing area formed near one edge of the overlap area and a bridge area formed near the other edge.

As described above, according to one embodiment of the present invention, an increase in electrical losses of thin film electrodes which is indicated as a problem may be fixed.

Also, the occurrence of parasitic capacitance caused by electrodes arranged in proximity to each other may be suppressed.

Also, a quality factor may be increased by fixing an increase in resistance which occurs due to thin film electrodes.

Although a variety of exemplary embodiments of the present invention have been described above as examples, the above description on the variety of embodiments is merely exemplary and it is apparent to those of ordinary skill in the art that a variety of modifications or equivalents of the present invention may be made from the above description.

Also, since the present invention may be implemented in a variety of other forms, the present invention is not limited to the above description which is for completing the disclosure of the present invention and provided for completely informing those of ordinary skill in the art of the scope of the present invention. It should be noted that the present invention is defined by only the claims.

What is claimed is:

1. An acoustic resonator comprising:
   a substrate comprising a first cavity;
   a first electrode formed above the substrate;
   a piezoelectric layer formed on one surface of the first electrode; and
   a second electrode formed on one surface of the piezoelectric layer,
   wherein the piezoelectric layer includes a longitudinal section that does not contact a longitudinal section of the first electrode,
   wherein a first interpolar cavity extends at least partially between the longitudinal section of the first electrode and the longitudinal section of the piezoelectric layer,
   wherein the piezoelectric layer includes an end face extending from the one surface of the piezoelectric layer, the end face partially defines the longitudinal section of the piezoelectric layer, and the end face is spaced apart from the longitudinal section of the first electrode via the first interpolar cavity, wherein the second electrode contacts the longitudinal section of the piezoelectric layer, and extends to and contacts the first interpolar cavity which spaces the first electrode at least partially apart from the piezoelectric layer, and wherein the piezoelectric layer is formed to be longitudinally cut at a position that does not contact the longitudinal section of the first electrode.

2. The acoustic resonator of claim 1, wherein the first interpolar cavity covers the longitudinal section of the first electrode and part of the substrate, and comes into contact with a bottom surface to which the second electrode extends.

3. The acoustic resonator of claim 1, further comprising a second interpolar cavity which spaces the second electrode at least partially apart from the piezoelectric layer.

4. The acoustic resonator of claim 1, wherein the second electrode comprises a wing area having a second cavity between the second electrode and the piezoelectric layer, and the wing area is formed so that the second cavity is closed.

5. The acoustic resonator of claim 1, wherein the second electrode comprises a wing area having a second cavity on one side and a bridge area having a third cavity on the other side between the second electrode and the piezoelectric layer, and wherein the second cavity, the third cavity, and the first interpolar cavity are filled with air.

6. The acoustic resonator of claim 1, wherein the first electrode and the piezoelectric layer comprise an overlap area corresponding to one edge to the other edge of the first cavity, and wherein the second electrode is formed to be thicker in an extending area than in the overlap area.

7. The acoustic resonator of claim 1, wherein the second electrode has a thickness which extends in a V-shape or U-shape according to a shape of the longitudinal section of the piezoelectric layer.

* * * * *